United States Patent
Seo et al.

(10) Patent No.: US 9,224,917 B2
(45) Date of Patent: Dec. 29, 2015

(54) LIGHT EMITTING DIODE HAVING PHOTONIC CRYSTAL STRUCTURE AND METHOD OF FABRICATING THE SAME

(75) Inventors: Won Cheol Seo, Ansan-si (KR); Joo Won Choi, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 13/984,147

(22) PCT Filed: Jan. 17, 2012

(86) PCT No.: PCT/KR2012/000373
§ 371 (c)(1),
(2), (4) Date: Aug. 7, 2013

(87) PCT Pub. No.: WO2012/108627
PCT Pub. Date: Aug. 16, 2012

(65) Prior Publication Data
US 2013/0320301 A1  Dec. 5, 2013

(30) Foreign Application Priority Data

Feb. 11, 2011  (KR) ........................ 10-2011-0012300

(51) Int. Cl.
*H01L 33/22* (2010.01)
*H01L 33/10* (2010.01)
(Continued)

(52) U.S. Cl.
CPC ................ *H01L 33/22* (2013.01); *H01L 33/10* (2013.01); *H01L 33/0079* (2013.01); *H01L 33/20* (2013.01); *H01L 2933/0083* (2013.01)

(58) Field of Classification Search
CPC ........... H01L 2224/32225; H01L 2224/48227; H01L 2224/73265; H01L 2224/48091; H01L 2924/00
USPC ........ 257/13, 98, E33.067, 99; 438/29, 22, 26
See application file for complete search history.

(56) References Cited

U.S. PATENT DOCUMENTS

| | | | |
|---|---|---|---|
| 6,885,034 B1 * | 4/2005 | Schoenfeld | H01L 33/20 257/79 |
| 7,566,576 B2 * | 7/2009 | Murofushi | H01L 21/182 438/29 |

(Continued)

FOREIGN PATENT DOCUMENTS

| | | |
|---|---|---|
| CN | 101257077 | 9/2008 |
| CN | 101308890 | 11/2008 |

(Continued)

OTHER PUBLICATIONS

International Search Report issued on Aug. 22, 2012 in International Application No. PCT/KR2012/000373.

*Primary Examiner* — Jaehwan Oh
(74) *Attorney, Agent, or Firm* — H.C. Park & Associates, PLC

(57) ABSTRACT

Disclosed are a light emitting diode (LED) having a photonic crystal structure and a method of fabricating the same. An LED comprises a support substrate, a lower semiconductor layer positioned on the support substrate, an upper semiconductor layer positioned over the lower semiconductor layer, an active region positioned between the lower and upper semiconductor layers, and a photonic crystal structure embedded in the lower semiconductor layer. The photonic crystal structure may prevent the loss of the light advancing toward the support substrate and improve the light extraction efficiency.

9 Claims, 5 Drawing Sheets

(51) Int. Cl.
*H01L 33/00* (2010.01)
*H01L 33/20* (2010.01)

(56) References Cited

U.S. PATENT DOCUMENTS

| | | | | |
|---|---|---|---|---|
| 8,017,970 B2* | 9/2011 | Katsuno | H01L 33/32 | 257/99 |
| 8,026,119 B2* | 9/2011 | Kim | H01L 21/0242 | 257/E25.032 |
| 8,115,224 B2 | 2/2012 | Kim | | |
| 8,154,034 B1* | 4/2012 | Zhang | H01L 33/0079 | 257/90 |
| 8,183,075 B2* | 5/2012 | Kim | H01L 21/0242 | 438/46 |
| 8,299,493 B2* | 10/2012 | Son | H01L 33/02 | 257/103 |
| 8,329,488 B2* | 12/2012 | Kim | H01L 21/0242 | 257/E25.032 |
| 8,377,724 B2* | 2/2013 | Katsuno | H01L 33/32 | 257/96 |
| 8,530,256 B2* | 9/2013 | Shibata | H01L 21/0242 | 257/103 |
| 8,609,449 B2* | 12/2013 | Kim | H01L 21/0242 | 438/47 |
| 8,729,594 B2* | 5/2014 | Katsuno | H01L 33/32 | 257/99 |
| 8,779,437 B2* | 7/2014 | Shioda | H01L 21/02381 | 257/22 |
| 2005/0205886 A1* | 9/2005 | Murofushi | H01L 21/182 | 257/98 |
| 2008/0166826 A1* | 7/2008 | Hong | H01L 31/02164 | 438/29 |
| 2009/0230422 A1* | 9/2009 | Katsuno | H01L 33/32 | 257/99 |
| 2009/0323014 A1* | 12/2009 | Cunningham | G02B 5/28 | 351/44 |
| 2010/0041170 A1* | 2/2010 | Epler | H01L 33/0079 | 438/26 |
| 2010/0117070 A1* | 5/2010 | Adekore | H01L 21/0237 | 257/43 |
| 2010/0252859 A1* | 10/2010 | Son | H01L 33/02 | 257/103 |
| 2010/0264443 A1* | 10/2010 | Wakai et al. | | 257/98 |
| 2011/0053303 A1* | 3/2011 | Kim | H01L 21/0242 | 438/46 |
| 2011/0084301 A1* | 4/2011 | Epler | H01L 33/0079 | 257/98 |
| 2011/0117684 A1* | 5/2011 | Katsuno | H01L 33/32 | 438/22 |
| 2011/0227037 A1* | 9/2011 | Su | C23C 16/0227 | 257/13 |
| 2011/0272720 A1* | 11/2011 | Gardner | H01L 33/007 | 257/98 |
| 2012/0018755 A1* | 1/2012 | Speck | B82Y 20/00 | 257/98 |
| 2012/0018758 A1* | 1/2012 | Matioli | B82Y 20/00 | 257/98 |
| 2012/0021546 A1* | 1/2012 | Kim | H01L 21/0242 | 438/46 |
| 2012/0072931 A1* | 3/2012 | Imada | G11B 5/314 | 720/672 |
| 2012/0202306 A1* | 8/2012 | Kim | H01L 21/0242 | 438/47 |
| 2012/0267655 A1* | 10/2012 | Zhang | H01L 33/04 | 257/94 |
| 2013/0026531 A1* | 1/2013 | Seo | H01L 33/20 | 257/99 |
| 2013/0049050 A1* | 2/2013 | Weng | H01L 33/44 | 257/98 |
| 2013/0109121 A1* | 5/2013 | Kim | H01L 21/0242 | 438/47 |
| 2013/0200391 A1* | 8/2013 | Bedair | H01L 21/0237 | 257/76 |
| 2014/0217360 A1* | 8/2014 | Katsuno | H01L 33/32 | 257/13 |

FOREIGN PATENT DOCUMENTS

| | | |
|---|---|---|
| CN | 101783382 | 7/2010 |
| JP | 2008-117902 | 5/2008 |
| KR | 10-2008-0058722 | 6/2008 |
| KR | 10-2008-0068243 | 7/2008 |
| KR | 10-2009-0025670 | 3/2009 |

* cited by examiner

LIGHT EMITTING DIODE HAVING PHOTONIC CRYSTAL STRUCTURE AND METHOD OF FABRICATING THE SAME

CROSS-REFERENCE TO RELATED APPLICATIONS

This application is the National State entry of International Application PCT/KR2012/000373, filed on Jan. 17, 2012, and claims priority from and the benefit of Korean Patent Application No. 10-2011-0012300, filed on Feb. 11, 2011, which are incorporated herein by reference in their entirety for all purposes as if fully set forth herein.

BACKGROUND

1. Field

The present invention relates to a light emitting diode (LED) and a method of fabricating the same, and more particularly, to an LED having a photonic crystal structure and a method of fabricating the same.

2. Discussion of the Background

GaN-based light emitting diodes (LEDs) are widely used for display elements and backlights. Further, these LEDs have less electric power consumption and a longer lifespan as compared with conventional light bulbs or fluorescent lamps, so that their application areas have been expanded for general illumination while substituting for conventional incandescent bulbs and fluorescent lamps. Recently, deep ultraviolet (DUV) LEDs for emitting DUV light with the wavelength of 365 nm or less have been developed. The DUV LEDs can be variously applied to air and water sterilization, removal of surface pollutant, a photo-sensor such as a bio-agent detector, UV curing of polymer, medical analysis equipment, and the like.

In general, a DUV LED has a structure in which a multiple quantum well structure including a GaN-based well layer containing Al is interposed between an n-type AlGaN layer and a p-type AlGaN layer so as to emit short-wavelength light. Meanwhile, since the AlGaN layer does not generally come in ohmic contact with a metal, a p-type contact layer of GaN or quaternary AlInGaN having a small content of Al is employed. However, since the p-type contact layer is not transparent enough for DUV light to pass therethrough, a flip-chip bonding technique is employed so that UV light can be emitted through a transparent substrate.

Since a considerable amount of light emitted in the multiple quantum well structure is absorbed in the p-type contact layer, the light efficiency of the DUV LED is very low.

SUMMARY

Accordingly, the present invention is conceived to solve the aforementioned problems. An object of the present invention is to provide a light emitting diode (LED) and a method of fabricating the same, thereby capable of reducing the loss of light within the LED.

Another object of the present invention is to provide an LED and a method of fabricating the same, suitable for improving the light efficiency of a DUV LED.

According to an aspect of the present invention, there is provided a light emitting diode (LED) comprising: a support substrate; a lower semiconductor layer positioned on the support substrate; an upper semiconductor layer positioned over the lower semiconductor layer; an active region positioned between the lower and upper semiconductor layers; and a photonic crystal structure embedded in the lower semiconductor layer. The photonic crystal structure may prevent the loss of the light advancing toward the support substrate, thereby improving the light extraction efficiency.

The lower semiconductor layer may comprise a p-type contact layer, and the upper semiconductor layer may comprise an n-type contact layer. The active region may comprise an AlGaN well layer, and the p-type contact layer may be a p-type GaN layer or a p-type AlInGaN layer. The LED can emit DUV light having a wavelength of 240 to 365 nm through the AlGaN well layer. According to the present invention, the photonic crystal structure may prevent light from being absorbed and lost by the p-type contact layer, thereby remarkably improving the light efficiency. Further, since the photonic crystal structure is embedded in the lower semiconductor layer, an ohmic contact can be formed throughout a broad area of the lower semiconductor layer.

The photonic crystal structure may comprise a pattern of voids aligned along a surface of the support substrate. The width and height of each of the voids may be within a range from 50 to 200 nm, and the distance between two adjacent voids may be within a range from 50 nm to 1 μm.

The lower semiconductor layer may comprise at least one AlGaN layer positioned between the voids and the active region. The at least one AlGaN layer prevents the voids from reaching the active region.

The lower semiconductor layer may further a p-type contact layer positioned between the voids and the support substrate so as to cover the voids.

In some embodiments, the upper semiconductor layer may have a roughened surface. The upper semiconductor layer may comprise a pattern of recesses. The roughened surface may be formed not only outside the recesses but also inside the recesses, and thus the light extraction efficiency through the surface of the upper semiconductor layer can be more improved. Further, the upper semiconductor layer may comprise an n-type AlGaN layer, and the roughened surface may be formed on a surface of the n-type AlGaN layer.

According to another aspect of the present invention, there is provided a method of fabricating an LED, comprising: forming a first conductive semiconductor layer, an active region and a second conductive semiconductor layer on a growth substrate; forming a pattern of voids by partially patterning the second conductive semiconductor layer; forming a second conductive contact layer for covering the pattern of the voids; forming an ohmic contact layer on the second conductive contact layer; forming a support substrate on the ohmic contact layer; and removing the growth substrate and exposing the first conductive semiconductor layer. A photonic crystal structure is provided by the pattern of the voids, and thus it is possible to fabricate the LED having the photonic crystal structure embedded in the lower semiconductor layer between the support substrate and the active region.

In some embodiments, the forming of a pattern of voids may comprise forming a photoresist pattern on the second conductive semiconductor layer using a nano-imprinting technique, and partially etching the second conductive semiconductor layer using the photoresist pattern as an etching mask.

In other embodiments, the forming of a pattern of voids may comprise forming a metal pattern on the second conductive semiconductor layer, forming a pattern of voids, corresponding to the metal pattern, under the metal pattern by performing a reaction between the metal pattern and the second conductive semiconductor layer, and removing residues of the metal pattern.

The metal pattern may comprise at least one metallic material selected from the group consisting of Ta, Ti and Cr. These metallic materials react with a GaN-based semiconductor layer, so that voids are formed in the semiconductor layer.

The uppermost layer of the second conductive semiconductor layer may be a p-type AlGaN layer, a p-type GaN layer or a p-type AlInGaN layer.

In some embodiments, the method may further comprise forming a roughened surface on the exposed first conductive semiconductor layer. Accordingly, it is possible to improve the extraction efficiency of light generated in the active region. The method may further comprise forming a pattern of recesses by patterning the exposed first conductive semiconductor layer, before forming the roughened surface. Accordingly, the roughened surface is formed outside and inside the recesses, so that the light extraction efficiency can be more improved.

The first conductive semiconductor layer may comprise an n-type AlGaN layer, and the roughened surface may be formed on the n-type AlGaN layer.

According to the present invention, a photonic crystal structure embedded in a lower semiconductor substrate between a support substrate and an active region is formed, so that it is possible to prevent light from being lost in the lower semiconductor layer, thereby improving light efficiency. Particularly, a DUV LED can prevent a considerable amount of light from being lost by a p-type contact layer, thereby providing a high-efficiency DUV LED. Further, since the photonic crystal structure is embedded in the lower semiconductor layer, an ohmic contact can be formed throughout a broad region of the p-type contact layer.

BRIEF DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention

DETAILED DESCRIPTION OF THE ILLUSTRATED EMBODIMENTS

Figure 1:
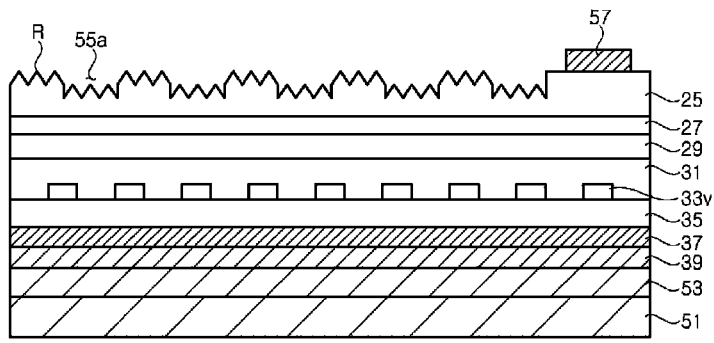
FIG. 1 is a sectional view illustrating a light emitting diode (LED) according to an exemplary embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

FIG. 1 is a sectional view illustrating a light emitting diode (LED) according to an embodiment of the present invention.

Referring to FIG. 1, the LED comprises a support substrate 51, a lower semiconductor layer 29, 31 and 35, an active region 27, an upper semiconductor layer 25 and a photonic crystal structure 33v. The LED may further comprise an ohmic contact layer 37, a protection layer 39, a bonding metal 53, and an upper electrode 57.

The support substrate 51 is distinguished from a growth substrate for growing compound semiconductor layers, and is a substrate attached to the previously grown compound semiconductor layers. Although the support substrate 51 may be a sapphire substrate, the present invention is not limited thereto, and the support substrate may be another kind of insulative or conductive substrate.

The active region 27 may be formed of a III-N-based compound semiconductor, e.g., an (Al, Ga, In)N semiconductor, and may have a single or multiple quantum well structure including, for example, an AlGaN well layer and an AlGaN barrier layer. Particularly, the active region 27 may comprise an AlGaN well layer for emitting deep ultraviolet (DUV) light.

Meanwhile, the lower semiconductor layer is positioned between the active region 27 and the support substrate 51, and may be composed of a plurality of layers. In this embodiment, the lower semiconductor layer may be a p-type semiconductor layer doped with Mg, and may comprise a p-type contact layer 35, a p-type clad layer 31 and an electron blocking layer 29. Here, the electron blocking layer 29 and the p-type clad layer 31 are formed of a semiconductor layer having a bandgap, through which the light emitted from the active region 27 can be transmitted, and may be, for example, an AlGaN layer. The p-type contact layer 35 may be an AlInGaN layer or GaN layer having a small content of Al so that the ohmic contact layer 37 can come in ohmic contact therewith. The p-type contact layer 35 may be formed to have a thickness of about 200 nm or less. In this embodiment, the lower semiconductor layer is not limited to the p-type semiconductor layers described above, and may further comprise other functional layers (not shown).

Meanwhile, the photonic crystal structure comprises a pattern of voids 33v arranged along a surface of the support substrate 51. There is provided a photonic crystal structure whose refractive index is regularly changed by the voids 33v. Hereinafter, the pattern of the voids 33v will be described as a photonic crystal structure 33v.

The photonic crystal structure 33v is embedded in the lower semiconductor layer. That is, the photonic crystal structure 33v is positioned within the lower semiconductor layer. As shown in this figure, the photonic crystal structure 33v may be formed in the p-type AlGaN layer 31, and may be covered with the p-type contact layer 35. Thus, the photonic crystal structure may be disposed near an interface between the p-type contact layer 35 and the p-type clad layer 31.

Figure 4:
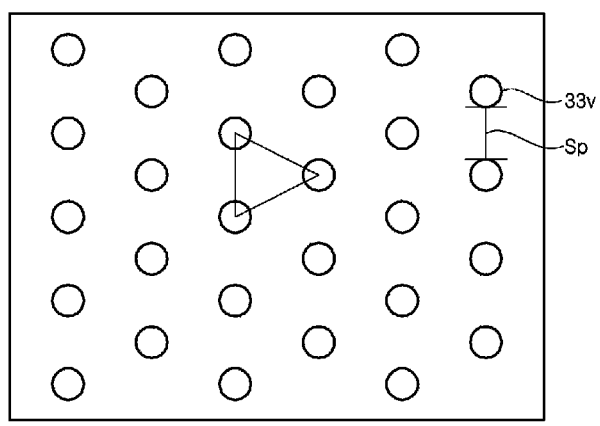
FIG. 4 is a schematic plan view illustrating a photonic crystal structure.

As shown in FIG. 4, the voids 33v may be arranged in the shape of an equilateral triangle, but the present invention is not limited thereto. That is, the voids may be regularly arranged in various shapes such as a square. The width and height of each of the voids 33v is less than about ½ of the wavelength of the light generated in the active region 27, and may be, for example, within a range from 50 to 200 nm. Meanwhile, the distance Sp between two adjacent voids 33v may be within a range from 50 nm to 1 μm.

The photonic crystal structure 33v is formed in the active region 27 and then reflects the light advancing toward the support substrate 51. The photonic crystal structure also allows the light guided within the semiconductor layers to be radiated toward the upper semiconductor layer 25.

Meanwhile, the upper semiconductor layer 25 is positioned on the active region 27. The upper semiconductor layer 25 comprises an n-type contact layer 25, and may further comprise other functional layers (not shown). The n-type contact layer 25 may be, for example, an n-type AlGaN layer doped with Si. The entire thickness of the upper semiconductor layer 25 may be approximately 2 to 4 μm.

A top surface R of the upper semiconductor layer 25 may be formed to be roughened. A pattern of recesses 55a may also be formed on the surface of the upper semiconductor layer 25, and the roughened surface R may be formed inside and outside the recesses 55a. The upper electrode 57 may be positioned on the upper semiconductor layer 25.

Meanwhile, the ohmic contact layer 37 forms an ohmic contact with the p-type contact layer 35. The ohmic contact layer may comprise, for example, Ni/Au. The ohmic contact layer 37 may also comprise a reflection layer, e.g., an Al layer. Further, the protection layer 39 may cover the ohmic contact layer 37 so as to protect the ohmic contact layer 37. The protection layer 39 may be formed, for example, of a metal layer such as Ni. Meanwhile, the support substrate 51 may be bonded to a side of the lower semiconductor layer, e.g., the protection layer 39 through the bonding metal 53 which may be made of, e.g., AuSn.

According to this embodiment, the photonic crystal structure 33v is embedded within the lower semiconductor layer, so that it is possible to reduce the absorption and loss of light into the p-type contact layer 35, thereby improving the light efficiency of the LED. Particularly, in case of a DUV LED, the loss of light caused by the p-type contact layer 35 is considerably large, so that the LED as described above may be particularly suitable for improving the light efficiency of the DUV LED.

Meanwhile, in this embodiment, if the support substrate 51 is a conductive substrate, the support substrate 51 may be used as a lower electrode, or a lower electrode may be formed under the support substrate 51. On the other hand, if the support substrate 51 is an insulative substrate, a lower electrode is formed above the support substrate 51 so as to be electrically connected to the ohmic contact layer 37.

FIGS. 2a to 2g are sectional views illustrating a method of fabricating an LED according to another embodiment of the present invention.

Figure 2A:
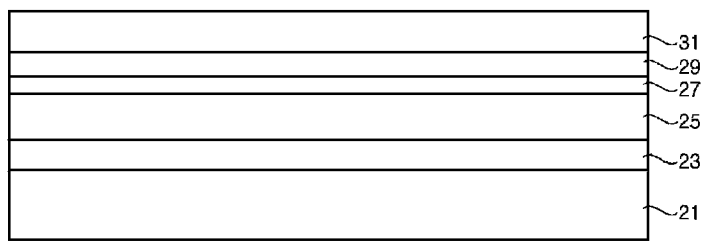
FIGS. 2a to 2g are sectional views illustrating a method of fabricating an LED according to an exemplary embodiment of the present invention.

Referring to FIG. 2a, epitaxial layers comprising a first conductive semiconductor layer 25, an active region 27 and a second conductive semiconductor layer are formed on a growth substrate 21. The first conductive semiconductor layer 25 may comprise, for example, an n-type contact layer 25, and the second conductive semiconductor layer may comprise an electron blocking layer 29 and a p-type clad layer 31.

The growth substrate 21 is not particularly limited as long as GaN-based semiconductor layers can be grown on the growth substrate 21. The growth substrate may be substrate made of, for example, sapphire, SiC, spinel, Si, GaN, GaO, ZnO or the like.

The composition of the active region may be controlled depending on the required wavelength of light. For example, the active region may comprise an AlGaN well layer for emitting DUV light. The first conductive semiconductor layer 25 may comprise an n-type AlGaN contact layer, and the electron blocking layer 29 and the p-type clad layer 31 may be formed of an AlGaN layer doped with Mg. The epitaxial layers may be formed using a metal organic chemical vapor deposition (MOCVD) or molecular beam epitaxy (MBE) technique.

A buffer layer 23 may be formed before the first conductive semiconductor layer 25 is formed on the growth substrate.

The buffer layer 23 may be formed of, for example, AlN. Further, a strain control layer (not shown) of a superlattice structure may be formed on the buffer layer 23.

Figure 2B:
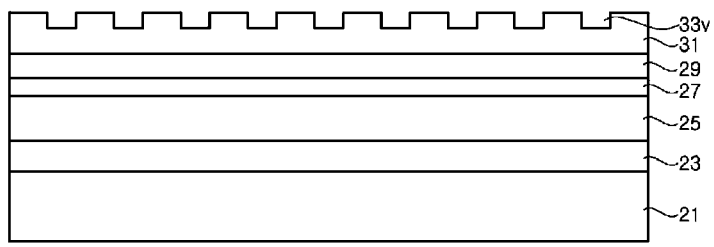

Referring to FIG. 2b, a pattern of voids 33v is formed in the second conductive semiconductor layer, e.g., the p-type clad layer 31. The voids 33v may be formed by forming a photoresist pattern on the p-type clad layer 31 using a nano-imprinting technique and partially etching the p-type clad layer 31 using the photoresist pattern as an etching mask. The p-type clad layer 31 may be etched, for example, through a wet etching using a phosphoric acid-based solution. After the etching is completed, the photoresist pattern is removed. The voids 33v may be partially formed in the p-type clad layer 31 so as to prevent the active region 27 from being damaged while the voids 33v are formed. Although the voids 33v may be arranged in the shape of an equilateral triangle as shown in FIG. 4, the present invention is not limited thereto. That is, the voids may be regularly arranged in various shapes such as a square.

Figure 2C:
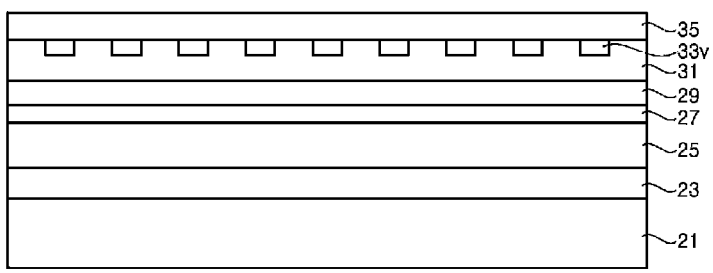

Referring to FIG. 2c, after the pattern of the voids 33 is formed, a second conductive contact layer 35 for covering the pattern of the voids is formed by re-growing a semiconductor layer. The second conductive contact layer 35 is formed with a semiconductor layer which may form an ohmic contact with a metal, wherein the second conductive contact layer 35 may be formed of, for example, a p-type GaN or a p-type AlInGaN.

Figure 2D:
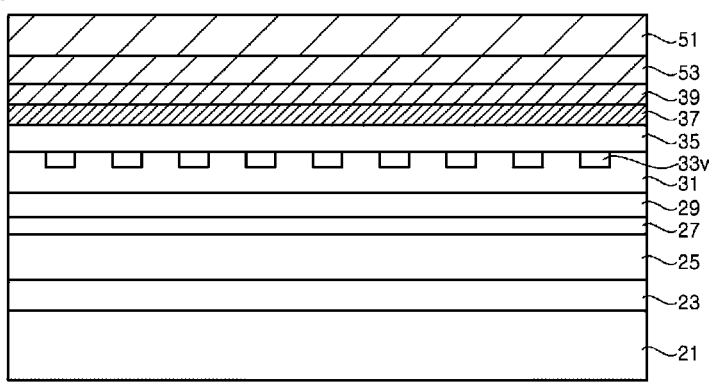

Referring to FIG. 2d, an ohmic contact layer 37 and a protection layer 39 are formed on the second conductive contact layer 35, and a support substrate 51 is bonded to the protection layer through a bonding metal 53.

The ohmic contact layer 37 may be formed of Ni/Au, and the ohmic contact layer 37 may comprise a reflection layer such as Al. The protection layer 39 is formed to protect the ohmic contact layer 37 from the bonding metal, and the protection layer 39 may be formed of, for example, Ni. The bonding metal 53 is used to bond the substrate 51 to the protection layer, and the bonding metal 53 may be formed of AuSn.

Figure 2E:
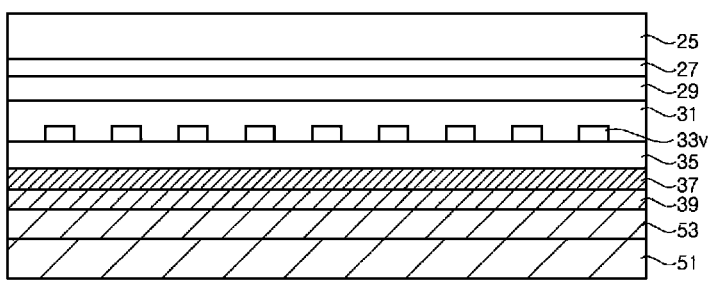

Referring to FIG. 2e, after the support substrate 51 is bonded to the protection layer, the growth substrate 21 is removed, and the first conductive semiconductor layer 25, e.g., the n-type contact layer 25 is exposed.

The growth substrate 21 may be removed using a laser lift-off (LLO), using a chemical lift-off (CLO) using a metal buffer layer such as ZnO, ZrN, TiN, CrN or NbN, or using a substrate isolation technique using the difference in thermal expansion coefficients. Alternatively, the growth substrate may be removed by etching or polishing the substrate.

After the growth substrate 21 is removed, the buffer layer 23 is also removed so that a surface of the n-type contact layer 25 is exposed.

Figure 2F:
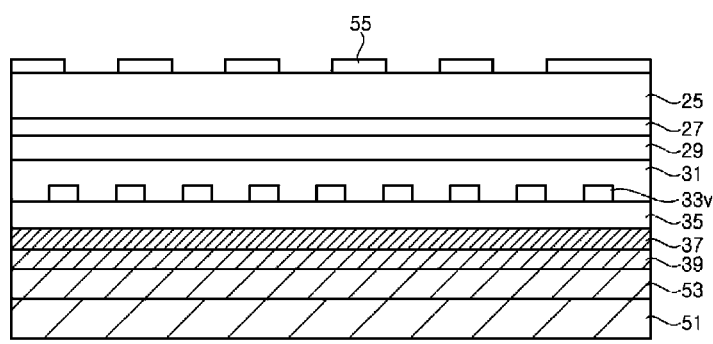
Figure 2G:
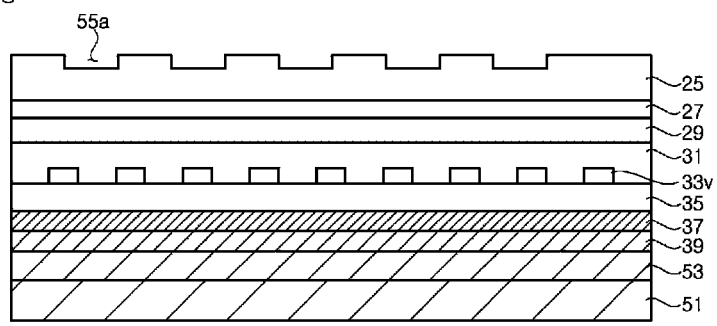

Referring to FIG. 2f, a photoresist pattern 55 for defining recess regions may be formed on the exposed n-type contact layer 25. Subsequently, as shown in FIG. 2g, the n-type contact layer 25 is partially etched using the photoresist pattern 55 as an etching mask, thereby forming recesses 55a.

Subsequently, the surface R of the n-type contact layer 25 having the recesses 55a formed therein may be formed to be roughened using an anisotropic wet etching such as a photo-electrochemical (PEC) wet etching. An upper electrode 57 is formed on the n-type contact layer 25, thereby completing an LED as shown in FIG. 1

FIGS. 3a to 3d are sectional views illustrating a method of fabricating an LED according to further another embodiment of the present invention. Here, another method of forming voids 33v is disclosed.

Figure 3A:
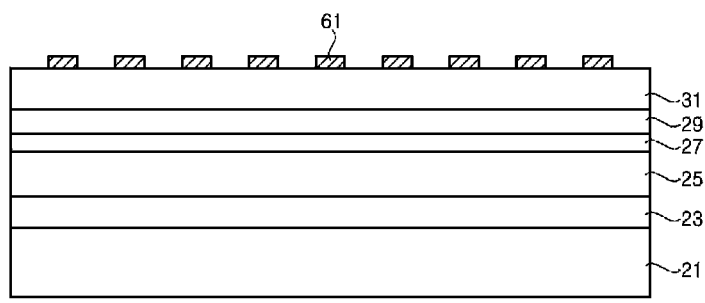
FIGS. 3a to 3d are sectional views illustrating a method of fabricating an LED according to an exemplary embodiment of the present invention.

Referring to FIG. 3a, a first conductive semiconductor layer, an active region 27 and a second conductive semiconductor layer are formed on a growth substrate 21, as described with reference to FIG. 2a. Subsequently, a metal pattern 61 is formed on the second conductive semiconductor layer, e.g., a p-type AlGaN layer 31. The metal pattern 61 is formed of a metal which reacts with a GaN-based semiconductor layer to form a nitride. The metal pattern may be formed of, for example, a metal containing at least one metallic material selected from the group consisting of Ta, Ti and Cr, or alloy thereof.

Figure 3B:
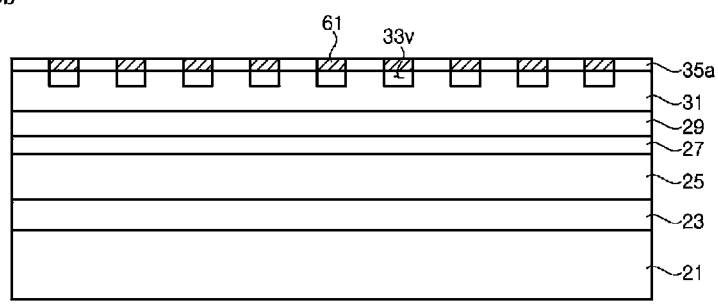

Referring to FIG. 3b, a GaN layer or AlInGaN layer 35a is grown after the metal pattern 61 is formed. For example, the p-type layer 35a may be grown by loading the growth substrate 21 into a reaction chamber, increasing the temperature of the growth substrate 21 to a temperature for growing a GaN-based semiconductor layer and then injecting a nitrogen source gas such as NH3 into the reaction chamber. At this time, a metal nitride is formed through a reaction between the metal pattern 61 and nitrogen in a p-type clad layer 31. Since the metal nitride is unstable at a temperature of about 900° C. or higher, the metal nitride is evaporated into the gas. Accordingly, voids 33v are formed under the metal pattern 61. Meanwhile, Ga or the like, decomposed in the p-type clad layer 31 reacts with the NH3 gas, thereby forming the p-type layer 35a. Thus, the p-type layer 35a can be formed without supplying a Ga source such as TMG.

The p-type layer 35a is grown on the p-type clad layer 31 having the metal pattern 61 exposed therefrom so as to cover the side surface of the metal pattern 61. The p-type layer 35a may also cover a portion of the top surface of the metal pattern 61.

Figure 3C:
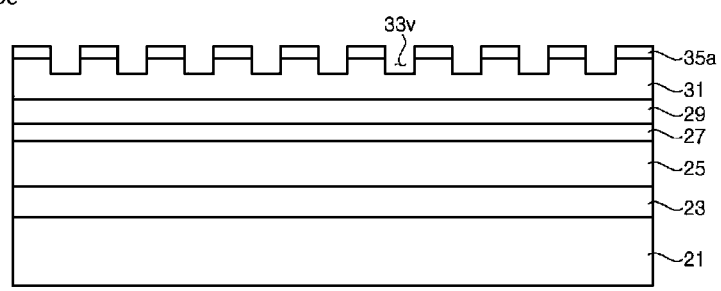

Referring to FIG. 3c, after the voids 33v are formed, the remaining metal pattern 61 is removed. The metal pattern 61 may be removed using an ultraviolet cleansing technique. Alternatively, the metal pattern 61 may be removed using an ultra cleaning technique in a solution in which the metal pattern 61 may be dissolved but the GaN-based semiconductor layer may not be dissolved. In this case, the solution may be, for example, water, hydrochloric acid, water and hydrochloric acid, sulfuric acid, water and sulfuric acid, nitric acid, water and nitric acid, hydrofluoric acid, water and hydrofluoric acid, water and sodium hydroxide, water and potassium hydroxide (water has a composition ratio of 0 to 90%), or the like.

Figure 3D:
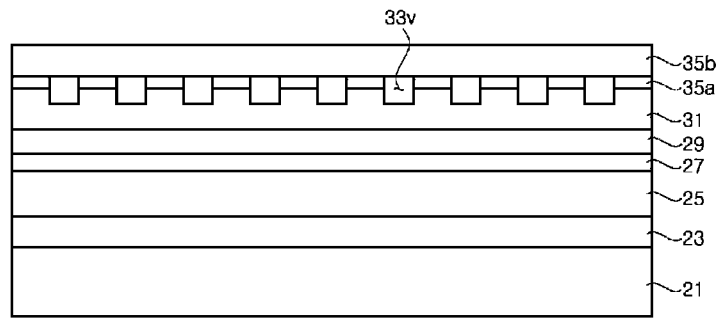

Referring to FIG. 3d, a p-type contact layer 35b is formed to cover the voids 33v. The p-type contact layer 35b may be formed with a GaN layer or AlInGaN layer, and may be formed of the same material as the p-type layer 35a.

Subsequently, processes as described with reference to FIGS. 2d to 2g are performed, thereby completing an LED.

According to this embodiment, since the metal pattern 61 is used to form the voids 33v, the pattern of the voids 33v can be precisely formed, and the semiconductor layer is not necessarily etched using the wet etching.

Figure 5:
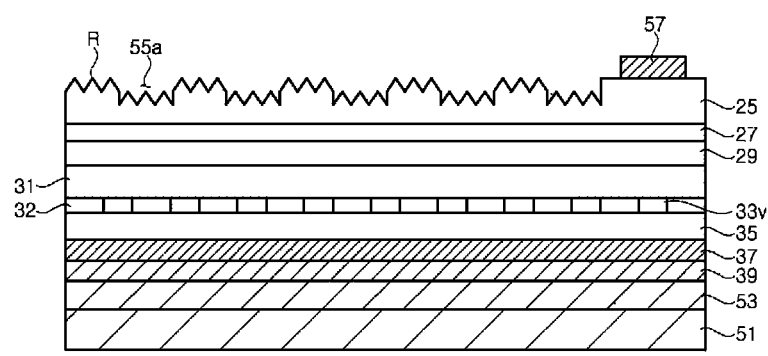
FIG. 5 is a sectional view illustrating an LED according to an exemplary embodiment of the present invention.

FIG. 5 is a sectional view illustrating an LED according to still another embodiment of the present invention.

Referring to FIG. 5, the LED according to this embodiment is substantially identical to the LED described with reference to FIG. 1. However, the LED according to this embodiment is different from the Led described with reference to FIG. 1 in that the voids 33v are not formed in the p-type clad layer 31, i.e., the p-type AlGaN layer, but formed in the p-type GaN layer 32. Although the voids 33v may come in contact with the p-type AlGaN layer 31, the present invention is not limited thereto, and a portion of the p-type GaN layer 32 may remain between the p-type AlGaN layer 31 and the voids 33v.

The voids 33v according to this embodiment may be formed by forming the p-type GaN layer 32 on the p-type clad layer 31 and then forming the voids 33v in the p-type GaN layer 32 as described with reference to FIG. 2b or 3b.

According to this embodiment, the voids are formed in the p-type GaN layer 32 without damaging the conventional p-type clad layer 31, thereby stabilizing the process of fabricating the LED.

Although the present invention has been described in connection with the preferred embodiments, it will be understood by those skilled in the art that various modifications and changes can be made thereto without departing from the spirit and scope of the present invention defined by the appended claims.

The invention claimed is:

1. A light emitting diode (LED), comprising:
a support substrate;
a first semiconductor layer disposed on the support substrate;
a second semiconductor layer disposed on the first semiconductor layer;
an active region disposed between the first and second semiconductor layers; and
a photonic crystal structure embedded in the first semiconductor layer,
wherein:
the first semiconductor layer comprises a p-type contact layer and a p-type clad layer;
the photonic crystal structure comprises a pattern of voids disposed on the support substrate;
the pattern of voids are disposed at an interface between the p-type contact layer and the p-type clad layer; and
a width and a height of each void of the pattern of voids is within a range of 50 to 200 nm, and a distance between two adjacent voids is within a range of 50 nm to 1 μm.

2. The LED of claim 1, wherein the second semiconductor layer comprises an n-type contact layer.

3. The LED of claim 2, wherein the active region comprises an AlGaN well layer, and the p-type contact layer comprises a p-type GaN layer or a p-type AlInGaN layer.

4. The LED of claim 1, wherein the first semiconductor layer comprises at least one AlGaN layer disposed between the voids and the active region.

5. The LED of claim 4, wherein the p-contact layer covers the voids.

6. The LED of claim 1, wherein the second semiconductor layer comprises a roughened surface.

7. The LED of claim 6, wherein the roughened surface comprises a pattern of recesses.

8. The LED of claim 6, wherein the second semiconductor layer comprises an n-type AlGaN layer.

9. The LED of claim 3, wherein the LED is configured to emit deep UV light having a wavelength in the range of 240 to 365 nm through the AlGaN well layer.

* * * * *